United States Patent [19]
Ogura et al.

[11] Patent Number: 6,002,611
[45] Date of Patent: Dec. 14, 1999

[54] FAST, LOW CURRENT PROGRAM WITH AUTO-PROGRAM FOR FLASH MEMORY

[75] Inventors: Seiki Ogura; Tomoko Ogura, both of Wappingers Falls, N.Y.

[73] Assignee: Halo LSI Design & Device Technology, Inc., Wappingers Falls, N.Y.

[21] Appl. No.: 09/120,361

[22] Filed: Jul. 22, 1998

[51] Int. Cl.$^6$ ................................................. G11C 16/00
[52] U.S. Cl. ................................ 365/185.28; 365/185.18; 365/185.27
[58] Field of Search ..................... 365/185.18, 185.28, 365/185.27, 185.33

[56] References Cited

U.S. PATENT DOCUMENTS

| | | | |
|---|---|---|---|
| 5,414,658 | 5/1995 | Challa | 365/185.18 |
| 5,532,964 | 7/1996 | Cernea et al. | 365/189.09 |
| 5,553,020 | 9/1996 | Veeney et al. | 365/185.27 |
| 5,638,324 | 6/1997 | Sim | 365/185.28 |
| 5,684,741 | 11/1997 | Talreja | 365/185.22 |
| 5,712,815 | 1/1998 | Bill et al. | 365/185.03 |
| 5,724,284 | 3/1998 | Bill et al. | 365/185.2 |
| 5,852,578 | 12/1998 | Hoang | 365/185.28 |

*Primary Examiner*—Tan T. Nguyen
*Attorney, Agent, or Firm*—George O. Saile; Stephen B. Ackerman

[57] ABSTRACT

In this invention is described a circuit and method for auto programming of a flash memory cell of an EEPROM. A step split gate is used that has low voltage and low current program conditions. This allows a load device to be connected to each bit line, and sets up a voltage divider between the cell being programmed and the load device. The load device limits the programming current and provides programming data to the cell being programmed. The load device is shut off when the bit line voltage is reduced below a predetermined reference, ending programming of the flash memory cell. The source to drain voltage increases as the memory cell is programmed as a result of the voltage divider between the load device and the cell being programmed thus maintaining pinch off. This produces more energy to program the flash cell and with proper design allows the programming efficiency to be relatively constant over the time that elections are injected onto the floating gate of the flash memory cell. This voltage divider effect also provides for more programming cycles because as charge is built up in the oxide in the vicinity of the floating gate the source to drain voltage is increased automatically providing more energy to program the cell.

20 Claims, 4 Drawing Sheets

| Mode | Bit | WL | SL |
|---|---|---|---|
| Read | 2.5V (0) | 3.3V (0) | 0V |
| Program | 3.3-Vt (3.3V) | 3.3V (0) | 5V |
| Erase | Float (3.3) | 5V (0) | 5V (0) |

| Program | Conventional | Invention | Effects |
|---|---|---|---|
| Bitline Voltage | 0V | 3.3-Vt | Allows auto-stop voltage detection |
| $V_{DS}$ | 5V | 3V | Degreased $I_{DS}$ |
| $V_{SB}$ | 0V | -(3.3-Vt) | Increased Injection Efficiency |

FAST, LOW CURRENT PROGRAM WITH AUTO-PROGRAM FOR FLASH MEMORY

RELATED PATENT

This patent application is related to U.S. Pat. No. 5,780,341, filing date Dec. 6, 1996 and issue date Jul. 14, 1998, assigned to a common assignee.

BACKGROUND OF THE INVENTION

1. Field of Invention

This invention refers to flash memory and in particular to the automatic programing of flash memory cells.

2. Description of Related Art

In an electrically erasable programmable read only memories (EEPROM), there exists a floating gate in each memory cell which is charged by hot elections injected onto the floating gate to store data into the memory cell. These floating gales are erased by a Fowler-Nordheim tunneling technique where a second gate called a control gate is grounded or negative biased and the drain is set at a high voltage. The injection of charge on a floating gate takes a period of time to accumulate the necessary amount of charge to establish the proper threshold voltage. A mechanism is therefore needed to determine when programming of floating gate device has been accomplished.

In U.S. Pat. No. 5,712,815 (Bill et al.) and U.S. Pat. No. 5,724,284 (Bill et al.) a method of programming a flash EEPROM uses reference cells to monitor and disable programming. Multiple threshold voltages are used in the memory cell to allow one erased state and three programmable states. The multiple threshold states are established using a reference cell array. Two transistors are placed in the bit line path to act as a switch and a current source. Bit line voltage is monitored by a reference voltage. The conventional memory cell requires high voltages and high programming currents resulting in a low bit line voltage and making it difficult to obtain adequate sensing margins for multilevel data.

Referring to U.S. Pat. No. 5,684,741 (Talreja), a current mirror is used to monitor current through an EEPROM memory cell that provides a signal to a differential amplifier. The device current during program is compared to a programmed cell current to determined when to stop programming of the memory cell. In U.S. Pat. No. 5,532,964 (Cernea et al.) a method and circuit using a novel sense amplifier is used to determine when programming of an EEPROM cell has been accomplished. The sense amplifier and associated programming circuitry are shared with a plurality of bit lines through a bit line selection circuit. In both U.S. Pat. No. 5,684,741 and U.S. Pat. No. 5,532,964 the sensing circuits are not compact enough to allow future implementation of wide page mode programming of every bit line in an array.

The programming of EEPROM cells is a relatively slow process because charge is injected onto a floating gate by means of the channel hot electron process. As charge is built up on the floating gate, the threshold voltage of the transistor with the floating gate rises and slows the process of inducing charge onto the floating gate. Without a method to detect when programming of an EEPROM cell has been accomplished, the process is even longer because a "program and then read method" must be used to determine if data has been programmed to the correct threshold voltage. There is also the potential of over programming the cell and reducing the number of times a particular cell can be reprogrammed because of charge buildup. A means by which the process of writing data to an EEPROM cell can be done quickly and efficiently is needed that automatically terminates programming when a cell is programmed, providing consistent programming with longevity of repeated erasure and programming.

SUMMARY OF THE INVENTION

In this invention an auto-program of an EEPROM memory cell is enabled by a step split gate device which has low current and low gate and drain voltages during programming. The step split gate device is disclosed in U.S. Pat. No. 5,780,341. It should be noted that the auto-program methods and circuitry can work for a device with similar low voltage and low current characteristics that is not necessarily the step split gate device. Auto-program is a new programming method in which a load transistor allows a memory cell to be programmed under optimum injection efficiency conditions. The load transistor is incorporated into a sensing feedback that inhibits the program conditions when the programming of the EEPROM memory cell is complete.

Optimum injection efficiency is achieved at low current when the gate to source voltage is near the memory cell threshold. A negative substrate bias, resulting from raising the bit line voltage, increases efficiency as a result of a horizontal electric field to accelerate electrons into the step split gate. A single load transistor is connected between circuit ground and a bit line of an EEPROM memory. This elevates the bit line to a voltage above ground so that a differential amplifier call be used to detect the bit line voltage, and when programming is complete, turn off the programming to a particular cell. A voltage divider is established between the cell being programming and the load tansistor which causes the bit line voltage to drop as the EEPROM cell is being programmed. As the memory cell threshold increases, the control gate voltage increases to be equal to the increased threshold voltage. When the cell reaches programmed state, the bit line voltage drops below a reference voltage of a differential amplifier used to sense the bit line voltage. The differential amplifier, upon sensing the bit line voltage below the reference voltage, turns off the load transistor terminating programming of the cell. If there is all attempt to reprogram a cell that is already programmed, the bit line will immediately drop below the reference level of the differential amplifier and the load transistor will be controlled off ending the reprogramming attempt. Thus there is no over programming of the cell and program inhibit is achieved. To reprogram a cell, the cell must first be erased which resets the floating gate and the threshold of the cell transistor.

A single load device can be used for bit line current control because current, gate to source voltage and gate to drain voltage of the memory cell device are low during programming. Unlike conventional implementations, the load current is determined by transistor sizing, not through a current mirror or other circuitry. This reduces the number of devices needed and in turn relaxes layout pitch. Since the memory cell used is a low voltage and low current device, many more bits can be programmed at once.

The voltage divider that is formed between the cell transistor and the load transistor provides a mechanism by which the rate of injecting electrons onto the floating gate is relatively constant over time as the cell is programmed. When electrons are injected onto the floating gate of the cell transistor, the threshold of the cell transistor increases, decreasing the voltage drop across the load transistor. The Source to drain voltage of the cell transistor increases providing more energy to accelerate more electrons onto the floating gate. If the cell transistor is properly designed, a relatively constant programming rate of electrons onto the floating gate will exist until the load transistor is turned off by the sensing circuitry.

The voltage divider between the cell transistor and the load transistor also maintains an improved reprogramming life time. Over many programming cycles electrons will get trapped in the oxide in the vicinity of the floating gate. This increases the threshold voltage of the cell transistor decreasing the voltage drop on the load transistor and increasing the source to drain voltage. The increase in source to drain voltage provides more energy to accelerate additional electrons onto the floating gate.

The load transistor and the differential amplifier provide good control of the program current and the threshold level of the EEPROM cell transistor. This consistent control provides the capability to achieve a multilevel flash memory which can be accomplished by changing the reference voltage of the differential amplifier.

To facilitate the use of one load transistor per EEPROM bit line, a memory cell transistor with a floating gate is required that has a low programming current. A low current device is needed to prevent an excessive amount of voltage drop across the bit line resistance. Such a device as previously disclosed in U.S. Pat. No. 5,780,341 has a step split gate with low voltage and low current program conditions. The use of the step split gate transistor, or other transistors with similar low voltage and low current characteristics, as the EEPROM memory cell device provides the low current conditions that allows one load transistor and sensing circuit for each bit line. Previous to the step split gate device, programming currents for a single cell were too high to accommodate the resistance of the bit line and only one of a few bits could be programmed in parallel. Other possible configurations allowed by the step split gate memory cell are one load transistor per bit line with multiple bit lines connected through bit line switches to one differential amplifier; and one load transistor and differential amplifier per multiple bit lines using bit line switches.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
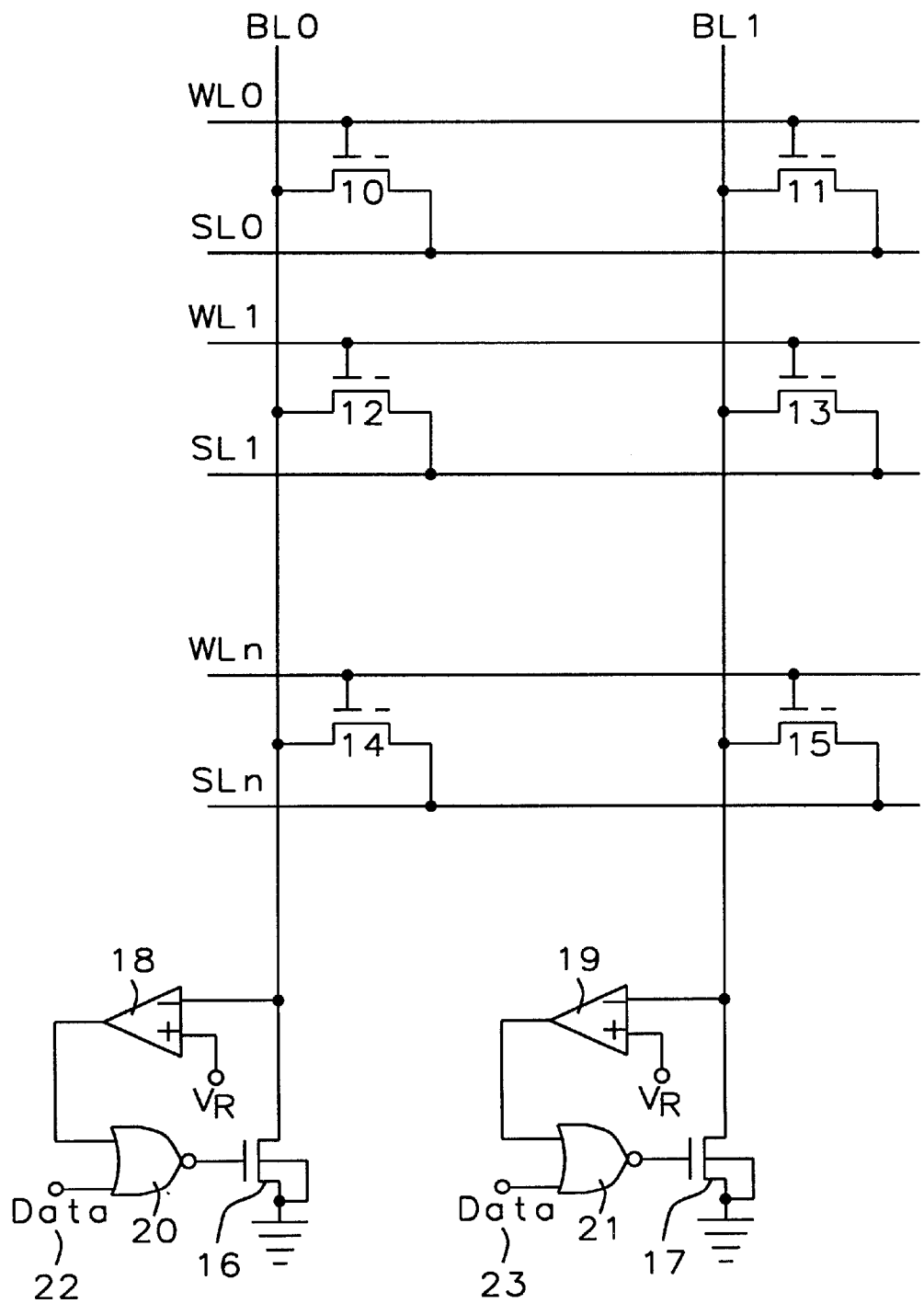
FIG. 1 is a schematic diagram of circuitry for automatic programming of a step split gate EEPROM cell.

Shown in FIG. 1 is an array of split gate transistors 10, 11, 12, 13, 14 and 15 connected to bit lines BL0 and BL1, word lines WL0, WL1, and WLn, and source lines SL0, SL1 and SLn. A load transistor 16 is connected between circuit ground and bit line BL0 and load transistor 17 is similarly connected between circuit ground and bit line BL1. The negative input terminal of a differential amplifier 18 is connected to bit line BL0 to sense the bit line voltage. The positive terminal of differential amplifier 18 is connected to a reference voltage $V_R$. The output of differential amplifier 18 is connected to one input of a logical NOR circuit 20 with programming data 22 connected to the other input of the NOR circuit 20. The output of the NOR circuit 20 is connected to the gate of the load transistor 16. Automatic programming of the EEPROM cells connected to bit line BL0 is accomplished by first connecting programming data being supplied to NOR circuit 20 to bit line BL0 through load transistor 16. As the cell connected to BL0 is programmed, the bit line voltage drops as a result of the voltage divider between the cell transistor and the load transistor. When the BL0 voltage drops below the value of the reference voltage $V_R$, the differential amplifier 18 sends a positive pulse to the NOR circuit 20 turning off the load transistor 16 and ending programming of the EEPROM cell.

Continuing to refer to FIG. 1, the negative input terminal of differential amplifier 19 is connected to bit line BL1 to sense the bit line voltage, and the positive terminal of differential amplifier 19 is connected to the reference voltage $V_R$. The output of differential amplifier 19 is connected to one input of a NOR circuit 21. The other input to the NOR circuit 21 is connected to programming data 23. The output of the NOR circuit 21 is connected to the gate of the load transistor 17. Automatic programming of the EEPROM cells connected to bit line BL1 is accomplished by first connecting programming data being supplied to NOR circuit 21 to bit line BL1 through load transistor 17. As the cell connected to BL1 is programmed, the bit line voltage drops as a result of the voltage divider between the cell transistor and the load transistor. When the BL1 voltage drops below the value of the reference voltage $V_R$, the differential amplifier 19 sends a positive pulse to the NOR circuit 21 turning off the load transistor 17 and ending programming of the EEPROM cell.

Figures 2, 3, 4:
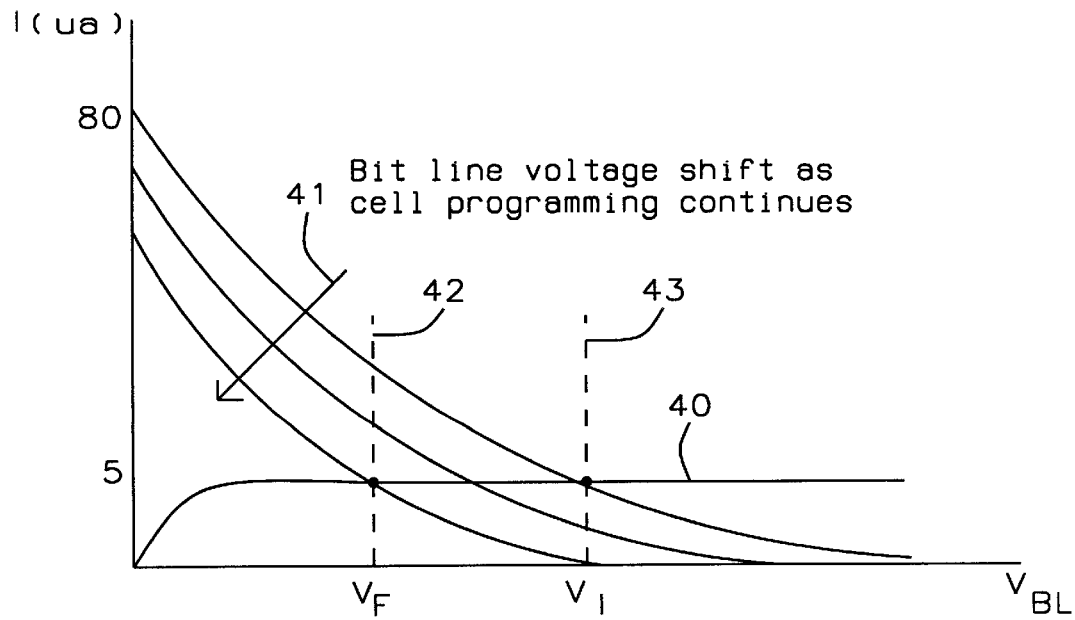
FIG. 2 is a table showing voltage settings needed to set the step split gate EEPROM cell into the read, program and erase modes.
FIG. 3 is a table comparing voltage settings of a conventional EEPROM to that of the step split gate.
FIG. 4 is a graph of load current versus bit line voltage during programming of a step split gate EEPROM cell.

Referring to FIG. 2 along with FIG. 1 provides an understanding of the voltages needed to set the EEPROM memory cells in a particular mode (read, program or erase). The voltages shown in FIG. 2 are for a step split gate device as previously disclosed in the referenced U.S. Pat. No. 5,780,341. Using the split gate transistor 10 as an example and viewing FIG. 2, data stored on the floating gate of transistor 10 can be erased by floating the bit line BL0, applying 5.0 volts to the word line WL0 and connecting 5.0 volts to the source line SL0. After erasing the data stored in transistor 10, data can be programmed onto the floating gate by turning on the load transistor 16 which sets the bit line BL0 to 3.3-Vti volts, applying 3.3 volts to the word line WL0 and connecting 5.0 volts to the source line, where Vti is the initial threshold voltage of the memory cell at the beginning of programming. Substrate bias is effectively −(3.3-Vt) due to the bit line voltage. These voltages are maintained for a period of time until sufficient charge is built up on the floating gate of transistor 10 to raise the threshold voltage to a point where the bit line BL0 voltage drops below the reference voltage $V_R$ on the differential amplifier 18. At this point the differential amplifier 18 provides a signal to the NOR gate 20 which turns off the load transistor 16 and ends programming. The voltages in parenthesis in table of FIG. 2 represent the unselected voltages of the various lines connected to the representative cell transistor 10. To read data stored on the floating gate of transistor 10, the bit line BL0 is raised to 2.5 volts, the word line WL0 is set to 3.3 volts and the source line SL0 is set to zero volts. The erasing, programming or reading of any of the other cells is accomplished in a like manner by applying similar voltages to the corresponding bit line, source line and word line associated with the cell on which an operation is required.

Referring to FIG. 3, a table is shown that compares this invention to conventional EEPROM programming. This bit line voltage during programming starts out at 3.3-Vti volts as compared to zero volts for a conventional EEPROM. The 3.3-Vti volts allows voltage detection of the bit line to automatically stop programming when a memory cell has reached a predetermined threshold voltage, and the substrate effective bias achieves injection efficiency. As the memory cell is programmed the voltage on the bit line drops because of the voltage divider effects between the memory cell as represented by floating gate transistor 10 and load transistor 16. When the bit line voltage goes below the reference voltage $V_R$, the load transistor 16 is turned off and programming is ended. When the bit line voltage is zero as with a conventional EEPROM, a more complicated current sensing circuitry is needed to produce an automatic programming stop when sufficient charge has been injected onto the floating gate.

Continuing to refer to FIG. 3, the source to drain voltage $V_{DS}$ is lower than conventional designs, 3.0 volts versus 5.0 volts. This reduces the drain/source current $I_{DS}$ and allows more cells to be programmed at the same time for a given power supply current. The substrate voltage $V_{SB}$ of this invention is effectively set −(3.3-Vt) volts to increase the electron injection efficiency onto the floating gate and reduce the programming time.

Referring to FIG. 4, a graph of load current versus bit line voltage is shown. Injection efficiency is greatest when current is low and the memory cell is close to the threshold voltage Vt. The load transistor is sized to constrain current to approximately five micro amperes 40 operating in saturation for a gate to source voltage, $V_{GS}$=3.3V, or at normal power supply voltage. When programming begins the initial bit line voltage 43 starts at $V_T$=3.3-Vti where Vti is the threshold voltage of the memory cell at the start of programming. As electrons are injected onto the floating gate, the threshold voltage of the EEPROM memory transistor (transistors 10, 11, 12, 13, 14, and 15 in FIG. 1) increases lowering the bit line voltage, and the I–V curve shifts left along the load line 40 as indicated by the arrow 41 pointing across the I–V curves. When the bit line voltage reaches a predetermined stop voltage 42 (shown as $V_F$ volts), the sensing feed back of the differential amplifier 18 19 will turn off the load transistor 16 17. The bit line voltage $V_F$=3.3-Vtf where Vtf is the threshold voltage of the memory cell at the end of programming.

Figure 5A:
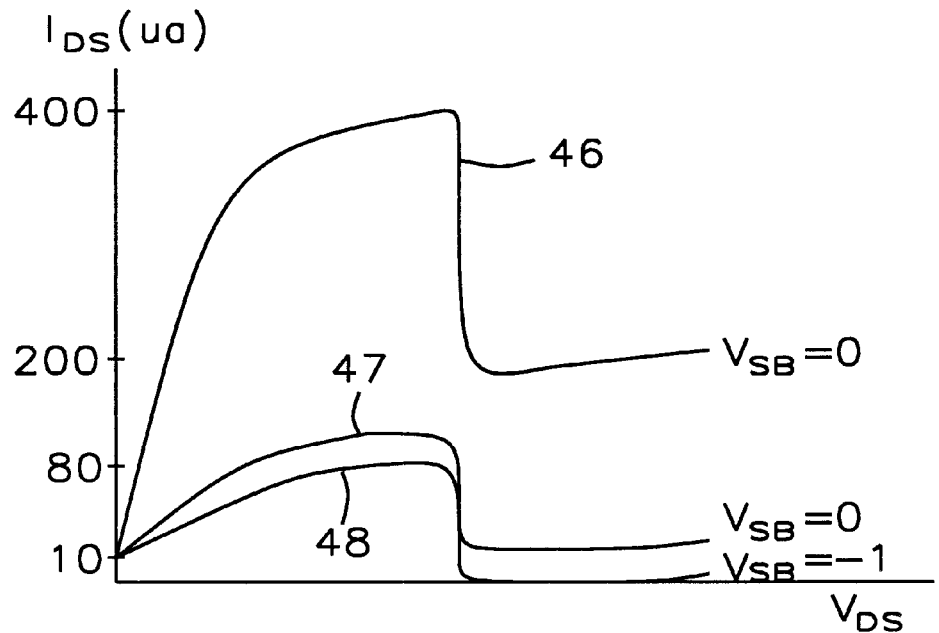
FIG. 5a is a graph comparing I-V curves during program for EEPROM memory cells.

Shown in FIG. 5a are I–V curves for EEPROM memory cells under program conditions. The current voltage relationship for a conventional stacked device is shown in curve 46 for a substrate bias $V_{SB}$=0. A much larger source-drain current is required than with the step spilt gate device 47 48 of the referenced U.S. Pat. No. 5,780,341. The step split gate device is optimized for high injection efficiency at low voltage and low current due to the step structure. The step spilt gate device 47 48 conducts up to approximately 80 ua during programming (much less than the conventional device) and then falls back to a current lower than 10 ua after the cell has been programmed, depending on the substrate bias $V_{SB}$. In comparison the conventional stacked gate memory cell 46 conducts up to approximately 400 ua during programming and then falls back to approximately 200 ua at zero substrate voltage after the cell has been programmed. It is the low voltage and low current of the step split gate device 47 48 of the referenced U.S. Pat. No. 5,780,341 that makes this invention possible and provides a smaller layout, more efficient injection, simpler circuitry, wider bit line voltage range, better sensing margins and improved multi-level sensing.

Figure 5B:
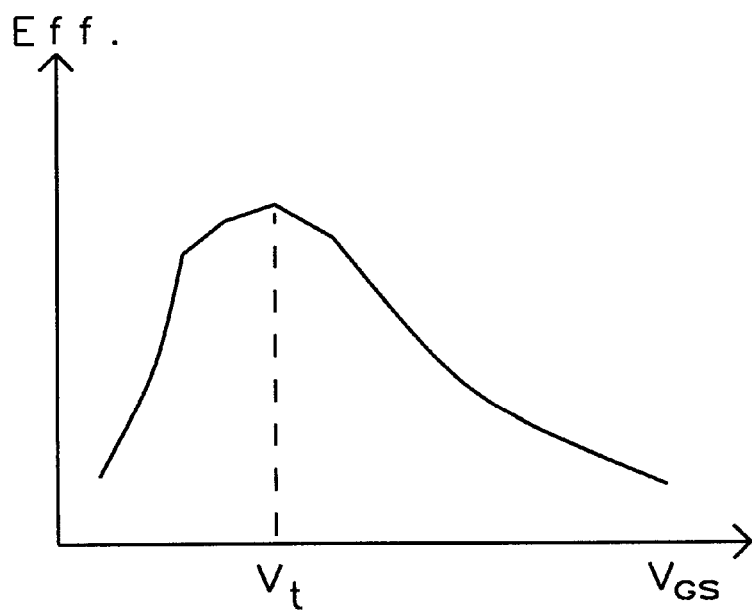
FIG. 5b is a graph showing injection efficiency versus gate to source voltage.

In FIG. 5b is shown electron injection efficiency as a function of gate to source voltage. Injection efficiency is defined as the gate current divided by the drain to source current. The highest efficiency occurs when $V_{GS}$=Vt where $V_{GS}$ is the gate to source voltage and Vt is the transistor threshold voltage. The step split gate transistors used in this invention operate at a gate to source voltage that is approximately equal to the transistor threshold voltage producing a high injection efficiency shown in FIG. 5b. Conventional devices have an additional high $V_{DS}$ requirement which means they operate further down the $V_{GS}$ axis in a less optimal efficiency region.

Figure 6:
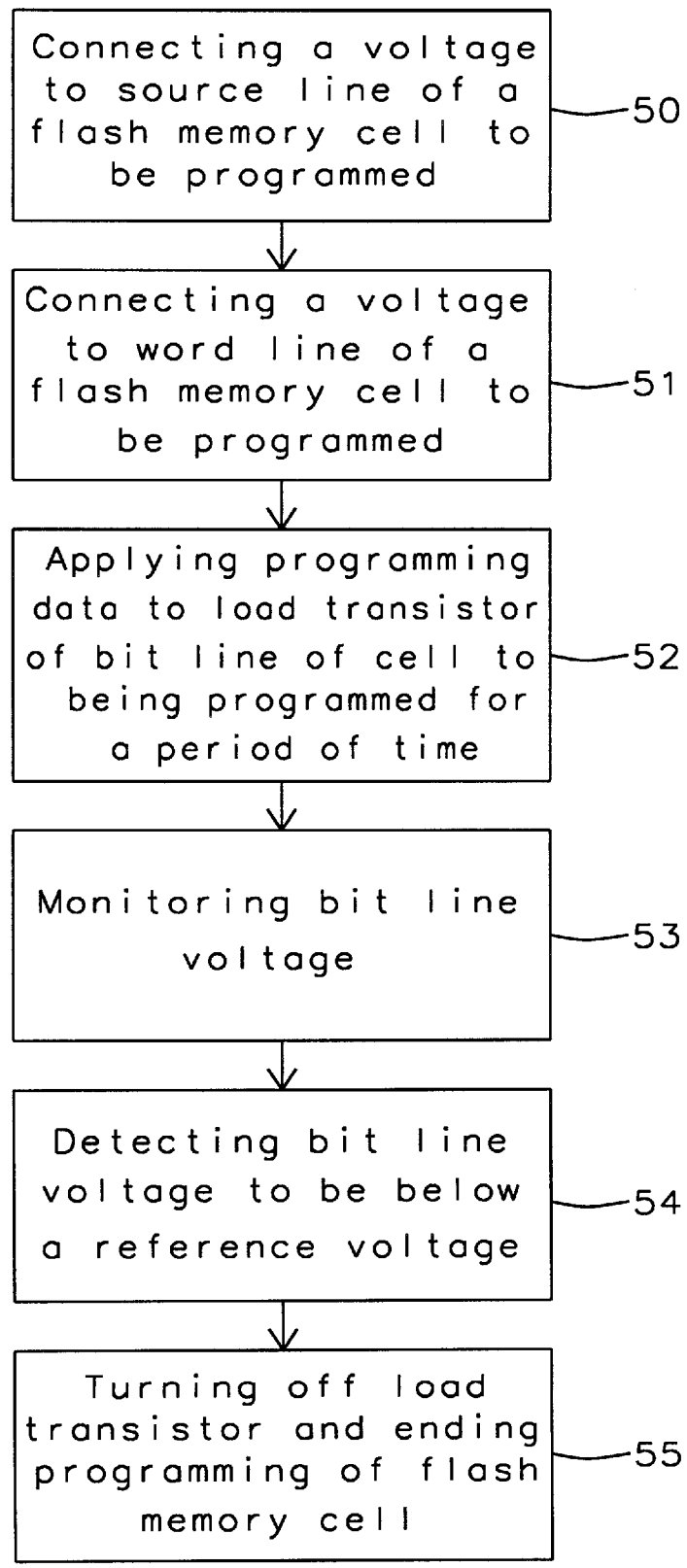
FIG. 6 is a flow diagram for the method of automatic programming of the step split gate EEPROM memory cell.

In FIG. 6 is shown a flow diagram of the method of auto programming step split gate flash memory cell. A voltage is connected to a source line SL0, SL1 to SLn of the step split gate memory cell lo be programmed 50. A voltage is connected to a word line WL0, WL1 to WLn of the flash memory cell to be programmed 51. Input data 22 determines whether the load transistor 16, 17 will be turned on. As the step split gate memory cell is programmed over time the bit line voltage is monitored 53. As the threshold of die step split gate memory cell transistor increases the bit line voltage decreases, and when the bit line voltage is detected below a reference voltage 54, the load transistor is turned off ending the programming of the EEPROM flash memory cell 55.

While the invention has been particularly shown and described with reference to preferred embodiments thereof, it will be understood by those skilled in the art that various changes in from and details may be made without departing from the spirit and scope of the invention.

What is claimed is:

1. A circuit for auto-programming of flash memories constructed of step split gate transistors, comprising:

a) an array of step split gate transistors organized in rows and columns as a flash memory, b) control gates of said step split gate transistors connected to word lines, c) drains of said step split gate transistors connected to bit lines, d) sources of said step split gate transistors connected to source lines, e) a load transistor connected to each bit line, f) a gate of said load transistor controlled by a differential amplifier, g) said differential amplifier senses bit line voltage and controls said load transistor on and off, h) said load transistor turned off by said differential amplifier when bit line voltage falls below a reference voltage terminating programming of a cell of said flash memory.

2. The circuit of claim 1, wherein the hit line voltage is a positive voltage greater than zero volts for said flash memory which allows bit line voltage detection for auto-programming of step split gate memory cells.

3. The circuit of claim 1, wherein one load transistor and one differential amplifier can be used for each bit line.

4. The circuit of claim 1, wherein one load transistor can be used for one bit line with one differential amiplifier for several bit lines using bit line switches.

5. The circuit of claim 1, wherein one load transistor and one differential amplifier can be used with several bit lines using a bit line switches.

6. The circuit of claim 1, wherein a multilevel flash can be achieved through control provided by said differential amplifier and said load transistor.

7. The circuit of claim 1, wherein said load transistor operates in saturated region during programming where current of said load transistor is determined by gate dimensions.

8. An efficient auto-programming circuit for flash memories, comprising:
   a) step split gate transistors connected as memory cells to a bit line in a flash memory,
   b) a load transistor connected to bit line and forming a voltage divider with said step split gate transistors,
   c) said load transistor connected between circuit ground and said bit line,
   d) a low bit line current defined by size of gate of said load transistor,
   e) said step split gate transistors operated near threshold at a high injection efficiency,
   f) a negative substrate bias producing an electric field to accelerate electrons into floating gate of step split gate transistor.

9. The circuit of claim 8, wherein injection efficiency is highest when said gate to source voltage is approximately equal to transistor threshold voltage.

10. The circuit of claim 8, wherein said voltage divider maintains a nearly constant injection rate during programming by increasing the source to drain voltage of the memory cell as the threshold of the said step split gate transistors increases.

11. The circuit of claim 8, wherein said voltage divider improves reprogramming lifetime by increasing the source to drain voltage of the memory cells as the threshold of said memory cells increases over time from trapped charge in oxide in vicinity of floating gate of said step split gate transistors.

12. The auto-programming circuit of claim 11, wherein efficiency of programming is maintained by a voltage divider between said flash memory cell and said load transistor, comprising:
   a) threshold voltage of said flash memory cell increases with programming of said cell decreasing programming of electrons onto floating gate of said split gate transistor,
   b) bit line voltage decreases as threshold voltage of flash memory cell increases,
   c) source to drain voltage of said split gate transistor increases as bit line voltage decreases,
   d) increase in said source to drain voltage compensates for increase in threshold voltage to effect a more constant programming efficiency.

13. The circuit of claim 11, wherein the bit line voltage is a positive voltage greater than zero volts for the split gate transistor flash memory that allows bit line voltage detection for auto-programming of flash memory cells.

14. The circuit of claim 11, wherein one load transistor can be used for each bit line and for several bit lines using a bit line switch.

15. The circuit of claim 11, wherein a multilevel flash can be achieved through control provided by said differential amplifier and said load transistor.

16. An auto-programming circuit for step split gate flash memories, comprising:
   a) step split gate transistors connected as cells to a bit line in a flash memory,
   b) a load transistor connected between circuit ground and said bit line,
   c) voltage of said bit line compared to a reference voltage by a differential amplifier,
   d) said load transistor controlled on and off by output of said differential amplifier,
   e) said differential amplifier controls said load transistor off when bit line voltage drops below said reference voltage turning off programming of a flash memory cell.

17. The auto-programming circuit of claim 16, wherein an increase in trapped charge in oxide of the split gate transistor increases said threshold voltage and is compensated by an increase in source to drain voltage which increases the number of reprograms of said flash memory cell.

18. A method of auto-programming a step split gate flash memory cell, comprising:
   a) connecting a voltage to a source line of a step split gate flash memory cell to be programmed,
   b) connecting a voltage to a word line of said step split gate flash memory cell to be programmed,
   c) applying programming data to a load transistor connected to a bit line of said step split gate flash memory cell to be programmed for a period of time,
   d) monitoring said bit line voltage,
   e) detecting said bit line voltage to be below a reference voltage,
   f) turning off load transistor and ending programming of flash memory cell.

19. The method of claim 18, wherein programming said step split gate flash memory cell builds up charge on floating gate, increasing threshold voltage of said cell and decreasing bit line voltage below said reference voltage.

20. The method of claim 18, wherein programming said step split gate flash memory cell builds up charge in oxide near floating gate, increasing threshold voltage of said cell, decreasing bit line voltage and increasing source to drain voltage to make programming more constant over time.

* * * * *